United States Patent
Miyagawa

Patent Number: 6,033,812
Date of Patent: Mar. 7, 2000

[54] MASK MANUFACTURING METHOD FOR FORMING AN ELECTRON BEAM DRAWING PATTERN

[75] Inventor: Seiji Miyagawa, Tokyo, Japan

[73] Assignee: NEC Corporation, Japan

[21] Appl. No.: 09/321,019

[22] Filed: May 27, 1999

[30] Foreign Application Priority Data

May 29, 1998 [JP] Japan .................................. 10-148953

[51] Int. Cl.$^7$ ...................................................... C03F 9/00
[52] U.S. Cl. .............................................. 430/5; 430/296
[58] Field of Search ........................................ 430/5, 296

[56] References Cited

FOREIGN PATENT DOCUMENTS 7-288224  10/1995  Japan .

Primary Examiner—Christopher G. Young
Attorney, Agent, or Firm—Ostrolenk, Faber, Gerb & Soffen, LLP

[57] ABSTRACT

In a photomask manufacturing method, third data is generated by multiplying the size of second data by x. Synthetic data is generated by synthesizing first data and the third data using first connection data from the first data and second connection data from the third data. It is verified whether a combination of transistors and wirings in the synthetic data matches with a circuit on which the layout design is based. A portion in which an error is detected by the verification is corrected. First EB drawing pattern data is generated from the first data and first connection data of the corrected synthetic data. Second EB drawing pattern data is generated by multiplying the third data and second connection data of the corrected synthetic data by 1/x. The EB drawing pattern is formed from a first EB drawing pattern formed on a photomask by drawing/exposing the first EB drawing pattern data and a second EB drawing pattern formed on the photomask by drawing/exposing the second EB drawing pattern data while the second EB drawing pattern data is increased by x times with respect to the first EB drawing pattern data.

19 Claims, 8 Drawing Sheets

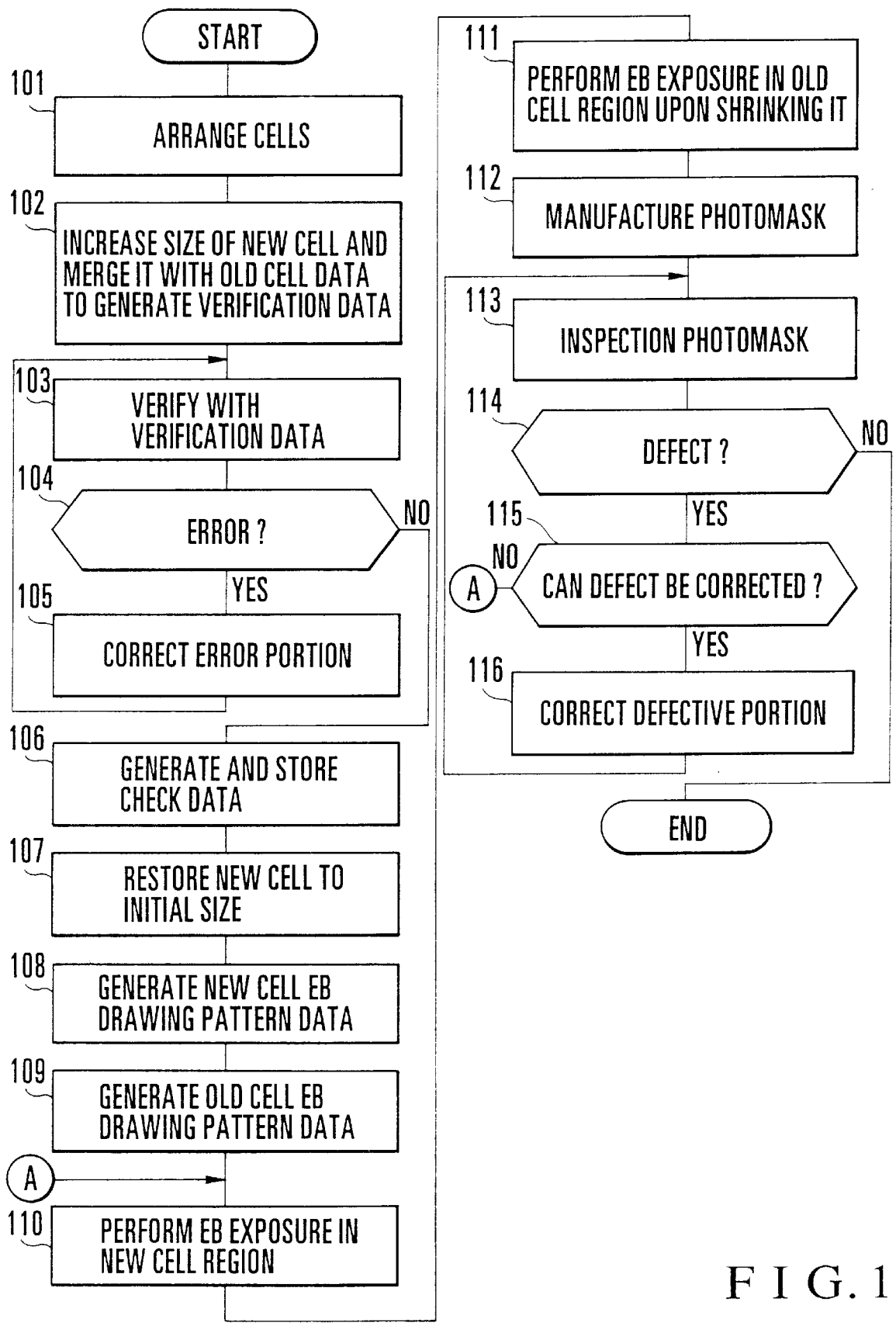
F I G. 1

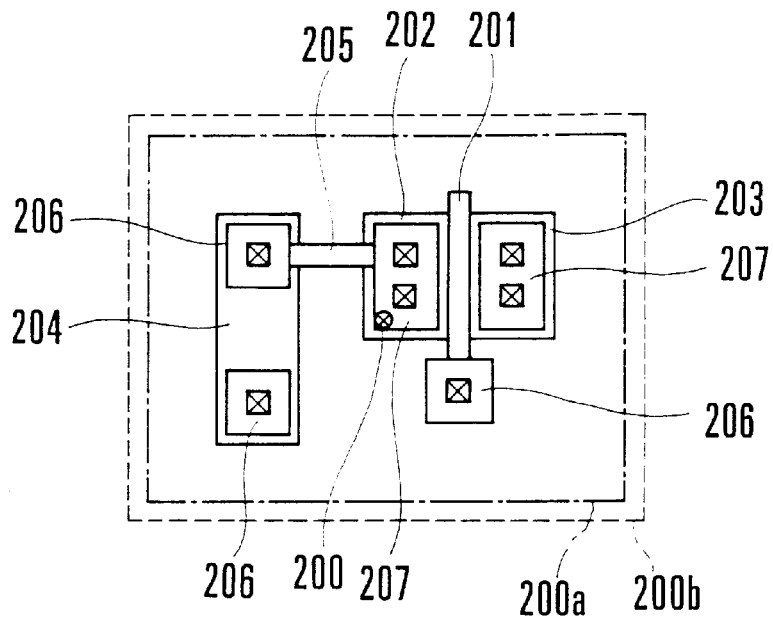
F I G. 2 A
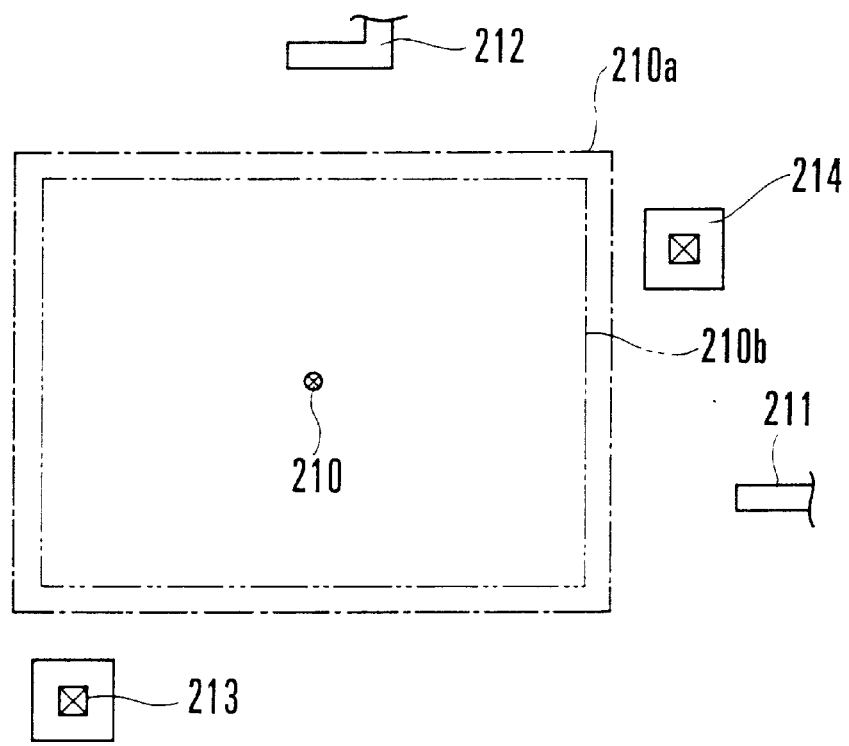
F I G. 2 B

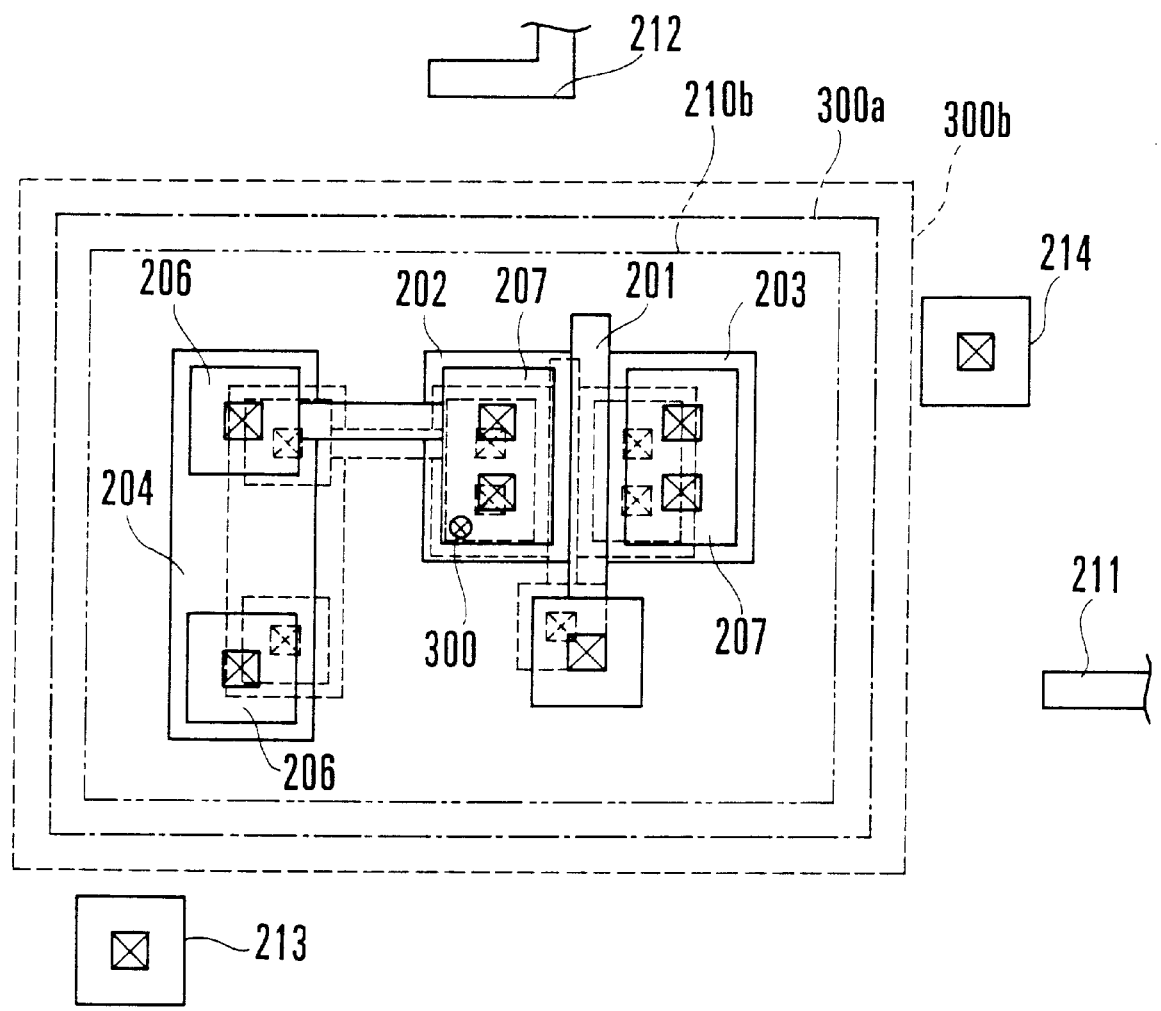
F I G. 3

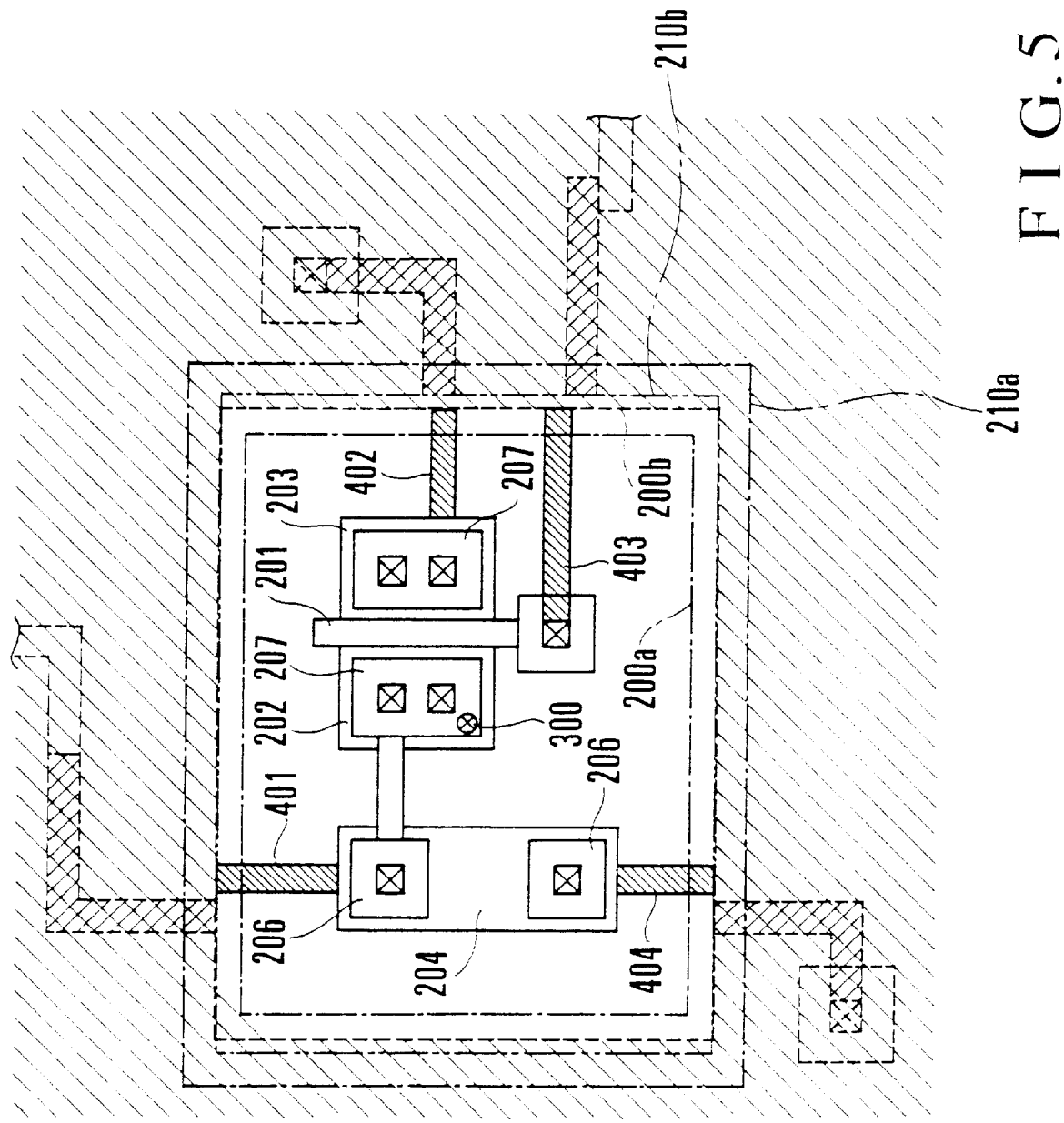
F I G. 5

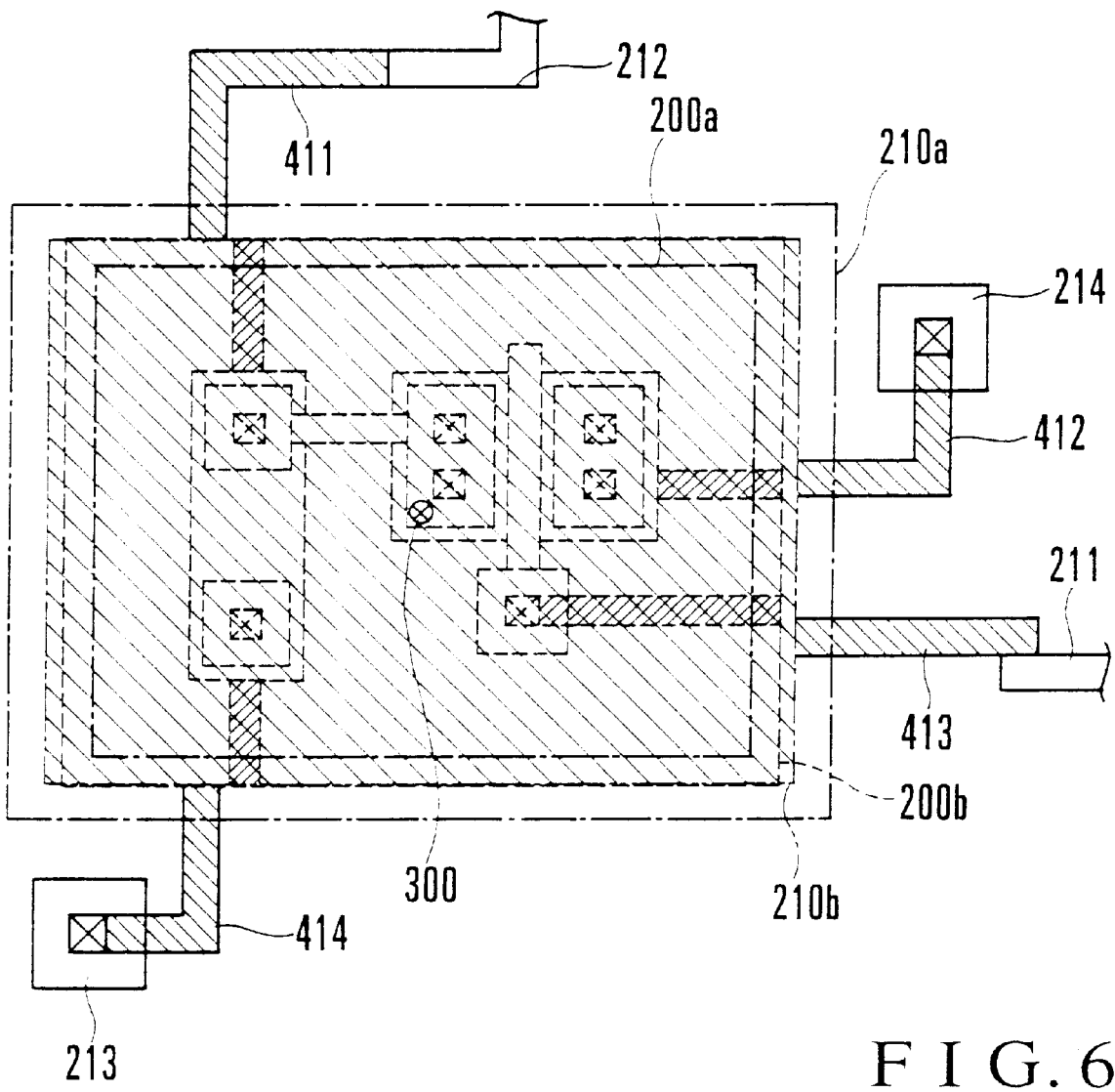
F I G. 6

MASK MANUFACTURING METHOD FOR FORMING AN ELECTRON BEAM DRAWING PATTERN

BACKGROUND OF THE INVENTION

The present invention relates to a mask manufacturing method of forming an EB drawing pattern to be drawn with an electron beam on a photomask by using EB drawing pattern data based on layout design.

A photomask is used in a photolithographic technology in the manufacture of an integrated circuit. This photomask is manufactured by forming an EB drawing pattern on a glass substrate using a metal light-shielding member consisting of chromium or the like. This EB drawing pattern is formed by a lithographic technique using an electron beam by using an electron beam (EB) lithography apparatus. The EB lithography apparatus draws an EB drawing pattern by using pattern data as layout design data obtained from the design data of an integrated circuit. The pattern data is composed of a combination of rectangular patterns corresponding to gate electrode portions, source/drain portions, and the like on an integrated circuit.

In this case, in layout design, layout data for forming basic elements such as transistors are prepared in advance and combined/arranged. Data obtained by combining a plurality of layout data and connecting them is used as EB drawing pattern data for the EB lithography apparatus.

The layout data prepared in advance include data for old and new processes in the manufacture of a semiconductor device. Of these data, layout data for an old process cannot be directly used on a mask used for a new process. Processing such as pattern dimension reduction (shrinkage) is therefore required for such data.

Formation of a gate electrode will be described next. First of all, a conductive film consisting of a gate electrode material is formed on a substrate, and a resist pattern in the shape of a gate electrode is formed on the conductive film by a photolithographic technique. The conductive film is selectively etched by using the resist pattern as a mask, thus forming a gate electrode. In this case, a photomask is used in photolithography for the formation of the resist pattern. However, a length L1 corresponding to the gate length of the EB drawing pattern on the photomask, a length L2 corresponding to the gate length of the resist pattern, and a gate length L3 of the formed gate electrode differ from each other. In many cases, L1>L2>L3.

For this reason, the gate length on the layout data is set to be longer than the gate length of the actual gate electrode L3. With improvements in semiconductor device manufacturing processes, the difference between the above lengths L1 and L3 decreases. When, therefore, layout data for an old process and layout data for a new process are to be used together, the size of either of the data must be changed.

Layout data for an old process is used in a reduced state. For this reason, layout data for a new process is enlarged, and the enlarged layout data for the new process is merged with the layout data for the old process. The EB lithography apparatus uniformly reduces the merged data. As a consequence, the EB drawing pattern data for the old process is reduced.

As layout design data, designed data is not used for EB drawing operation without any change. More specifically, a verification is performed by a simulation or the like to check the presence/absence of an error in the design data. For example, a design rule check (DRC) is performed to check whether the wiring space and the gate length comply with predetermined specifications, or layout vs schematic (LVS) is performed to check whether interconnections of transistors and wirings match with the circuit.

When enlarged data is merged with another data, off-grid rounding processing is performed in a computer for processing the data. This is because the EB lithography apparatus cannot use any data that is not set (laid) on grid points. However, this rounding processing produces many slits and the like.

Off-grid rounding processing will be briefly described. Pattern data used in the EB lithography apparatus has vertexes and pattern origins set on grid points based on the coordinate system set by the computer.

For example, as shown in FIG. 8A, in pattern data 800 constituted by patterns 801 and 802, cell centers 803 and 804 and vertexes are set on grid points 810. When the pattern data 800 is enlarged by 1.6 times, the vertexes of the enlarged patterns 801 and 802 and the cell centers 803 and 804 are located apart from the grid points 810, as shown in FIG. 8B.

In this state, this pattern data cannot be used in the EB lithography apparatus. As shown in FIG. 8C, therefore, the computer displaces the cell centers 803 and 804 to locate them on the grid points 810, and moves the vertexes of the patterns 801 and 802 onto the adjacent grid points 810 in this state.

With this operation, the cell centers 803 and 804 of both the patterns 801 and 802 are located on the grid points 810, and the respective vertexes are also located on the grid points 810. The resultant data can therefore be used in the EB lithography apparatus.

As shown in FIG. 8C, however, a slit (gap) 820 which is not present in the original data is produced between the patterns 801 and 802. With this data, portions that need to be connected are not connected. In addition, if the pattern 801 is a gate electrode, the gate length increases.

These portions are recognized as errors in a DRC or the like. These errors cannot be automatically corrected, and hence must be manually corrected until the check result indicates no error.

In this correction, for example, as shown in FIG. 8D, the pattern 801 is increased in length and decreased in width. As a result, the gap between the patterns 801 and 802 disappears, and all the patterns are set on grid points. This correction is, however, manually performed, and cannot be automatically performed by a computer.

It therefore takes much time to correct errors caused when patterns are shrunk to be used in the EB lithography apparatus.

SUMMARY OF THE INVENTION

It is an object of the present invention to provide a photomask manufacturing method which can generate EB drawing pattern data more quickly even when layout data that are processed into the EB drawing pattern data at different enlargement/reduction ratios are to be arranged together.

In order to achieve the above object of the present invention, there is provided a photomask manufacturing method of forming an EB drawing pattern on a photomask by using EB drawing pattern data obtained by layout design and made up of first data formed in a hierarchical structure of a plurality of cells and second data formed in a hierarchical structure of a plurality of cells, the second data being used on a photomask at a predetermined magnification ratio x with respect to the first data, comprising the first step of generating third data by multiplying a size of the second data by x, the second step of generating synthetic data by synthesizing the first data and the third data using first connection data from the first data and second connection data from the third data, the third step of verifying whether a combination of cells in the synthetic data matches with a circuit on which the layout design is based, and correcting a portion in which an error is detected by the verification, the fourth step of generating first EB drawing pattern data from the first data and first connection data of the corrected synthetic data, the fifth step of generating second EB drawing pattern data by multiplying the third data and second connection data of the corrected synthetic data by 1/x, and the sixth step of forming the EB drawing pattern from a first EB drawing pattern formed on the photomask by drawing/ exposing using the first EB drawing pattern data and a second EB drawing pattern formed on a photomask by drawing/exposing using the second EB drawing pattern data while the second EB drawing pattern data is increased by x times with respect to the first EB drawing pattern data.

In addition, there is also provided a mask manufacturing method of forming an EB drawing pattern on a photomadk by using EB drawing pattern data obtained by layout design and made up of first data formed in a hierarchical structure of a plurality of cells and second data formed in a hierarchical structure of a plurality of cells, the second data being used on the photomask at a predetermined magnification ratio x with respect to the first data, comprising the first step of generating third data by multiplying a size of the first data by 1/x, the second step of generating synthetic data by synthesizing the third data and the second data using first connection data from the third data and second connection data from the second data, the third step of verifying whether a combination of cells in the synthetic data matches with a circuit on which the layout design is based, and correcting a portion in which an error is detected by the verification, the fourth step of generating first EB drawing pattern data by multiplying the third data and first connection data of the corrected synthetic data by x, the fifth step of generating second EB drawing pattern data from the second data and second connection data of the corrected synthetic data, and the sixth step of forming the EB drawing pattern from a first EB drawing pattern formed on a photomask by drawing/ exposing the first EB drawing pattern data and a second EB drawing pattern formed on a photomask by drawing/ exposing the second EB drawing pattern data while the second EB drawing pattern data is increased by x times with respect to the first EB drawing pattern data.

BRIEF DESCRIPTION OF THE DRAWINGS

FIG. 1 is a flow chart for explaining a method of manufacturing pattern data according to an embodiment of the present invention;

FIGS. 2A and 2B are plan views respectively showing new and old cells;

FIG. 3 is a view of a layout showing a state in which the 1.25-times new cell is merged with the old cell;

FIG. 5 is a view for explaining generation of data used for an EB lithography apparatus;

FIG. 6 is a view for explaining generation of data used for the EB lithography apparatus;

DESCRIPTION OF THE PREFERRED EMBODIMENT

Figure 4:
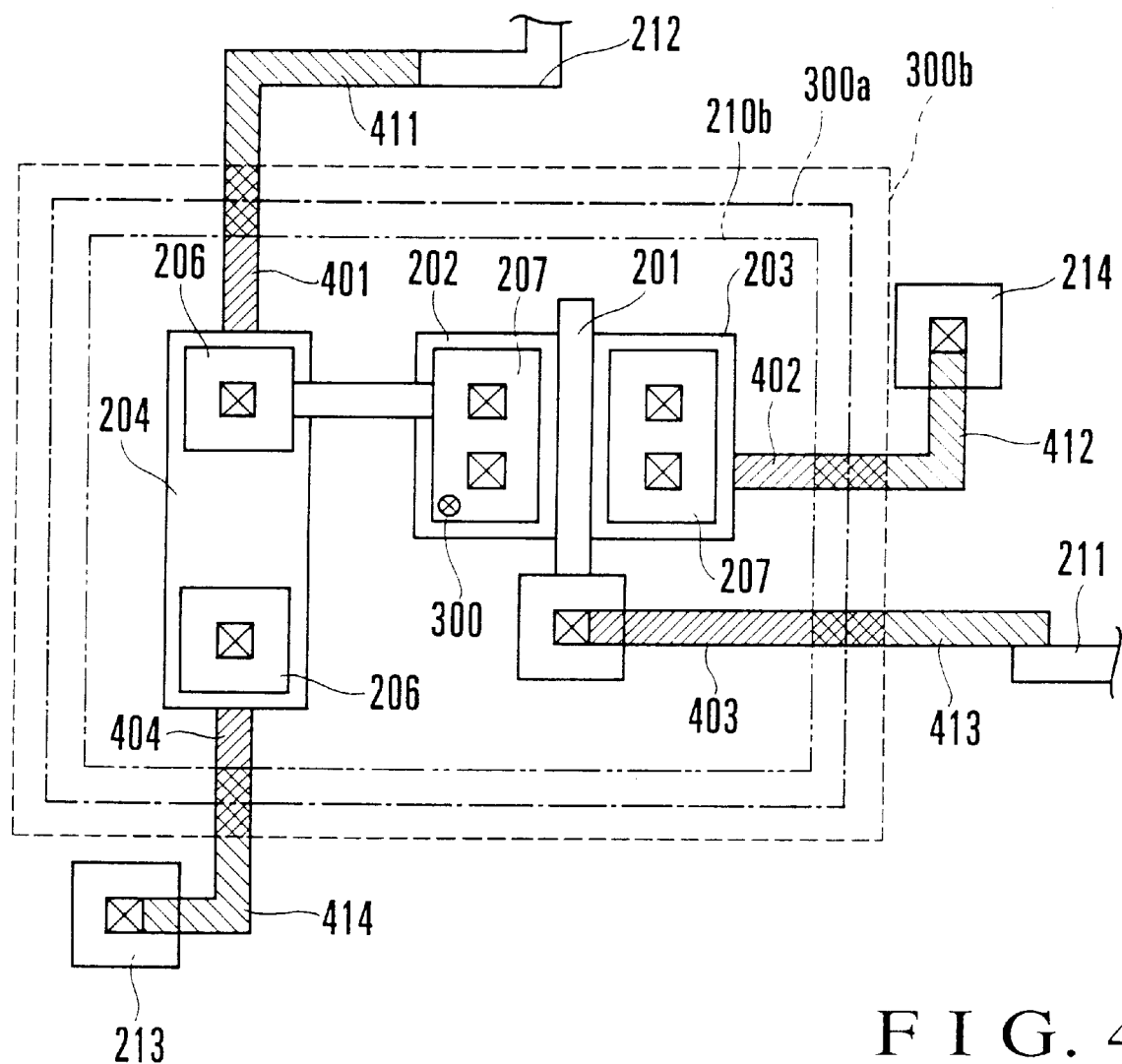
FIG. 4 is a view of a layout showing a state in which wirings are formed between the new and old cells.

The present invention will be described in detail below with reference to the accompanying drawings.

FIG. 1 is a flow chart for explaining a photomask manufacturing method according to an embodiment of the present invention. In addition, a case wherein layout data (old cell) for an old process and layout data (new cell) for a new process are mixed into one layout data will be described below. Assume that when layout data for an old process is increased in size by 0.8 times, the resultant data can be mixed with data for a new process.

Referring to FIG. 1, first of all, in step S101, old and new cells are placed at predetermined positions in an exposure region on a mask. In step S102, the size of the new cell is increased by 1.25 times, and the old cell is merged with the enlarged new cell into one layout data. Wirings are set between the respective cells to generate verification data. In step S103, an verification (DRC, LVS) is performed on the basis of the verification data generated in step S102.

It is then checked in step S104 whether the verification result has revealed an error. If YES in step S104, the error portion is modified in step S105. After the error portion is modified, the flow returns to step S103 to verify the verification data obtained by correcting the error portion. That is, modification is performed until no error is detected in verification processing in step S103. If it is determined in step S104 that no error is detected, the flow advances to step S106 to store the verification data having undergone the verification as photomask check data.

In step S107, of the corrected data, the sizes of the new cell and added wirings are increased by 0.8 times. That is, the sizes of the new cell and its wirings are restored to the initial sizes. In step S108, new EB drawing pattern data (first EB drawing pattern data) is generated by using the new cell restored to the initial size together with the wiring data. In step S109, old cell EB drawing pattern data (second EB drawing pattern data) is generated by using the old cell to which the wirings are added with the initial size being kept unchanged.

In step S110, an EB lithography apparatus is used to perform EB exposure of the new cell EB drawing pattern data in the region on the photomask forming glass substrate in which the new cell is to be placed. In step S111, the EB lithography apparatus is used to shrink the old cell EB drawing pattern data to 0.8 times in the region on the photomask forming glass substrate in which the old cell is to be placed and perform EB exposure.

Note that as a photomask forming substrate, for example, a 0.625-mm thick quartz substrate six inches square is used. A three-layered light-shielding film made up of chromium oxide, chromium, and chromium oxide layers is formed on the major surface of the quartz substrate by sputtering or the like. The light-shielding film is coated with an EB exposure resist.

In step S112, a photomask is manufactured by performing developing and etching for the photomask forming substrate having undergone EB exposure. In step S113, the manufactured photomask is checked. This check is performed by comparing/collating the image data of the EB drawing pattern formed by reading an optical image of the EB drawing pattern formed on the photomask with the check data stored in step S106.

In step S114, it is checked whether a defect is detected in the verification in step S113. If YES in step S114, it is checked in step S115 whether the defect can be corrected. If NO in step S115, the flow returns to step S110 to form a new photomask. If YES in step S115, the defect is corrected in step S116.

Assume that the defect includes, for example, adhesion of a foreign substance (dust) and the like. When adhesion of a foreign substance occurs, it is determined that the defect can be corrected. In this case, cleaning of the photomask is performed as correction. When the correction of the defect is complete, the flow returns to step S113. If it is determined in step S114 that no defect is detected, the manufacture of the photomask is complete.

The generation of the verification data in step S102 in FIG. 1 will be described in more detail with reference to FIGS. 2A and 2B.

A new cell has a transistor and a resistor constituted by a set of a plurality of basic cells. More specifically, as shown in FIG. 2A, the new cell is made up of basic cells including a gate electrode cell 201, a source cell 202, a drain cell 203, a resistor cell 204, a wiring cell 205, and contact cells 206 and 207. A cell center 200 is set in almost the central portion of the new cell. A boundary 200a is set as the outer boundary of the new cell.

As shown in FIG. 2B, the old cell includes a wiring cell 211 connected to an signal input (not shown), a wiring cell 212 connected to a signal output (not shown), a contact cell 213 connected to a power supply, and a contact cell 214 connected to ground. A cell center 210 is set in almost the central portion of the old cell. Although not shown, the data of the old cell includes not only the above data but also many data arranged outside the above data. A boundary 210a is set as the inner boundary of the old cell. The old cell therefore includes no data inside the boundary 210a.

As described above, the EB lithography apparatus performs exposure by using the new cell data without changing its size. In contrast to this, the EB lithography apparatus performs exposure upon multiplying the size of the old cell data by 0.8. For this reason, if, for example, the size of the boundary 200a is multiplied by 1.25, the boundaries 200a and 210a are so set as to overlap each other.

In generating verification data, first of all, a merge boundary 200b is set outside the boundary 200a of the new cell. This merge boundary 200b is set outside the boundary 200a at, for example, a distance of 2 $\mu$m. A merge boundary 210b is set inside the boundary 210a of the old cell. This merge boundary 210b is set inside the boundary 210a at, for example, a distance of 2×1.25 ($\mu$m).

The data of the new cell is then increased by 1.25 times, and the enlarged new cell is merged with the data of the old cell. At this time, the cell enters 200 and 210 shown in FIGS. 2A and 2B are positioned at a predetermined origin. The 1.25-times new cell data is not set on grid points, as shown in FIG. 8. In this case, the data is kept in this state.

FIG. 3 shows a state in which the 1.25-times new cell and the 1-times old cell are merged with each other. The cell centers 200 and 210 respectively shown in FIGS. 2A and 2B are positioned at an origin 300. Note that the cell indicated by the dashed line is the new cell before it is multiplied by 1.25.

The boundary of the 1.25-times new cell overlaps the boundary 210a (FIG. 2B) of the old cell. This boundary will be referred to as a new/old cell boundary 300a. The new/old cell boundary 300a is identical with the boundary 210a of the old cell. The merge boundary 210b is present inside the new/old cell boundary 300a. A merge boundary 300b is present outside the new/old cell boundary 300a. The merge boundary 300b is obtained by multiplying the size of the merge boundary 200b (FIG. 2A) by 1.25.

As shown in FIG. 4, new cell wirings 401 to 404 extend from the new cell. Old cell wirings 411 to 414 extend from the old cell. The new cell wirings 401 to 404 are disposed on the grid points obtained by multiplying the initial grid width, 0.02 $\mu$m, i.e., the 0.025-$\mu$m wide grid. This prevents rounding due to off-grid in generating EB drawing pattern data by multiplying the new cell data by 0.8.

In wiring design, the wirings are laid out such that each of the pairs of the new cell wiring 401 and the old cell wiring 411, the new cell wiring 402 and the old cell wiring 412, the new cell wiring 403 and the old cell wiring 413, and the new cell wiring 404 and the old cell wiring 414 are merged into one wiring.

In this case, the new cell wirings 401 to 404 are set to extend outward from the merge boundary 210b to the merge boundary 300b. In contrast to this, the old cell wirings 411 to 414 are set to extend inward from the merge boundary 300b to the merge boundary 210b. As a consequence, the new cell wirings 401 to 404 respectively overlap the old cell wirings 411 to 414 by 5 $\mu$m between the merge boundary 210b and the merge boundary 300b.

In this manner, verification data is generated in step S102 (FIG. 1).

As described above, the new cell is multiplied by 1.25 and used, but the verification data is not used for the EB lithography apparatus. For this reason, the data may be kept in the off-grid state in which the data is not set on the grid points. In this embodiment, since the data in the off-grid state is used without canceling the off-grid state, no slits and the like are generated.

Generation of check data will be described next.

When EB drawing pattern data is to be generated, enlargement processing for data and conversion for EB drawing pattern data are executed with layer synthesis processing on a computer. Mathematical expressions in this layer synthesis processing include expressions for thinning/thickening processing. This thinning/thickening processing is performed for specific patterns such as wiring, impurity-implanted layer, and diffusion layer patterns. When data with different exposure reduction ratios are to be processed, the thinning/thickening amounts must be set in accordance with the ratio between the exposure reduction ratios such that the patterns formed on a wafer by using a photomask meet the same process standard. In addition, even when data with different exposure reduction ratios are to be processed, since the minimum grid is determined by the performance of the EB lithography apparatus and these data must be uniformly set to the minimum grid, the thinning/thickening amounts dot not perfectly coincide with the ratio between the exposure reduction ratios.

In the process of performing thinning/thickening processing by layer synthesis in the generation of check data, when EB drawing pattern data respectively based on old and new cells are to be generated, since the thinning/thickening amounts vary, check data cannot be directly generated from the layout verification data for the above EB exposure. In other steps in which no thinning/thickening processing is performed, however, check data can be generated by simply multiplying the layout verification data for the above EB exposure by 0.8.

Generation of check data in the step of performing thinning/thickening processing by layer synthesis processing will be described next.

After layout verification data for EB exposure is generated in the above manner, the new cell is restored to the initial size, as shown in FIG. 5. That is, the new cell portion of the layout verification data for EB exposure after verification is multiplied by 0.8 around the origin 300 which is the cell center.

Layer synthesis processing is then performed for the layout data of the 0.8-times new cell. This new cell includes the wirings 401, 402, 403, and 404 obtained when the new cell is enlarged and connected to the old cell. Likewise, layer synthesis processing is performed for the layout data of the old cell. This old cell also includes the wirings 411, 412, 413, and 414 obtained when the new cell is enlarged and connected to the old cell.

After layer synthesis processing is separately performed for the new and old cells, the old cell is simply multiplied by 0.8. Finally, the 0.8-times old cell and the new cell having undergone the layer synthesis processing are merged with each other around their origins.

In the data generated in this manner, error convergence has already been made in the new and old cells by separately performing DRC and LVS verification, and error convergence in the connection portions has already been made by DRC. Only an overall LVS verification after the layer synthesis processing has not been performed. However, no problem arises if the wirings at the connection portions do not change before and after the layer synthesis processing.

If the wirings at the connection portions change before and after that, an LVS verification must be performed upon correcting the mathematical expressions for layer synthesis processing for the new and old cells into mathematical expressions for layer synthesis based on a rule file so as to process verification data with large actual thickening/thinning amounts.

With the above operation, check data using in all the manufacturing processes are generated.

Generation of data used for the EB lithography apparatus after verification of verification data will be described next.

A method of generating data used for the EB lithography apparatus by using a new cell will be described first with reference to steps S107 to S113 in FIG. 1. As shown in FIG. 5, the new cell is restored to its initial size. That is, the new cell of the verification data after verification and the new cell wiring portions are multiplied by 0.8 around the origin 300 as the cell center (step S107).

The data outside the merge boundary 200b of the 0.8-times initial new cell is masked. Assume that the EB lithography apparatus does not perform electron beam exposure on the data outside the merge boundary 200b which is indicated by the hatched portion in FIG. 5. In addition, the old cell wirings 411 to 414 are erased. With this operation, new cell EB drawing pattern data subjected to electron beam exposure is generated by using only the new cell and the new cell wirings 401 to 404 (step S108).

A method of generating data used for the EB lithography apparatus by using an old cell will be described next. As shown in FIG. 6, the data inside the merge boundary 210b is masked. That is, the EB lithography apparatus does not perform electron beam exposure on the data inside the merge boundary 210b which is indicated by the hatched portion in FIG. 6. In addition, the new cell wirings 401 to 404 are erased. With this operation, old cell EB drawing pattern data subjected to electron beam exposure is generated by using only the old cell and the old cell wirings 411 to 414 (step S109).

The new cell EB drawing pattern data is then used to perform electron beam exposure with its origin being set at the mask origin without changing the magnification (step S110). In contrast to this, the old cell EB drawing pattern data is used to perform electron beam exposure after the origin of the data is positioned at the mask origin, and the data is multiplied by 0.8 (step S110).

Figure 7:
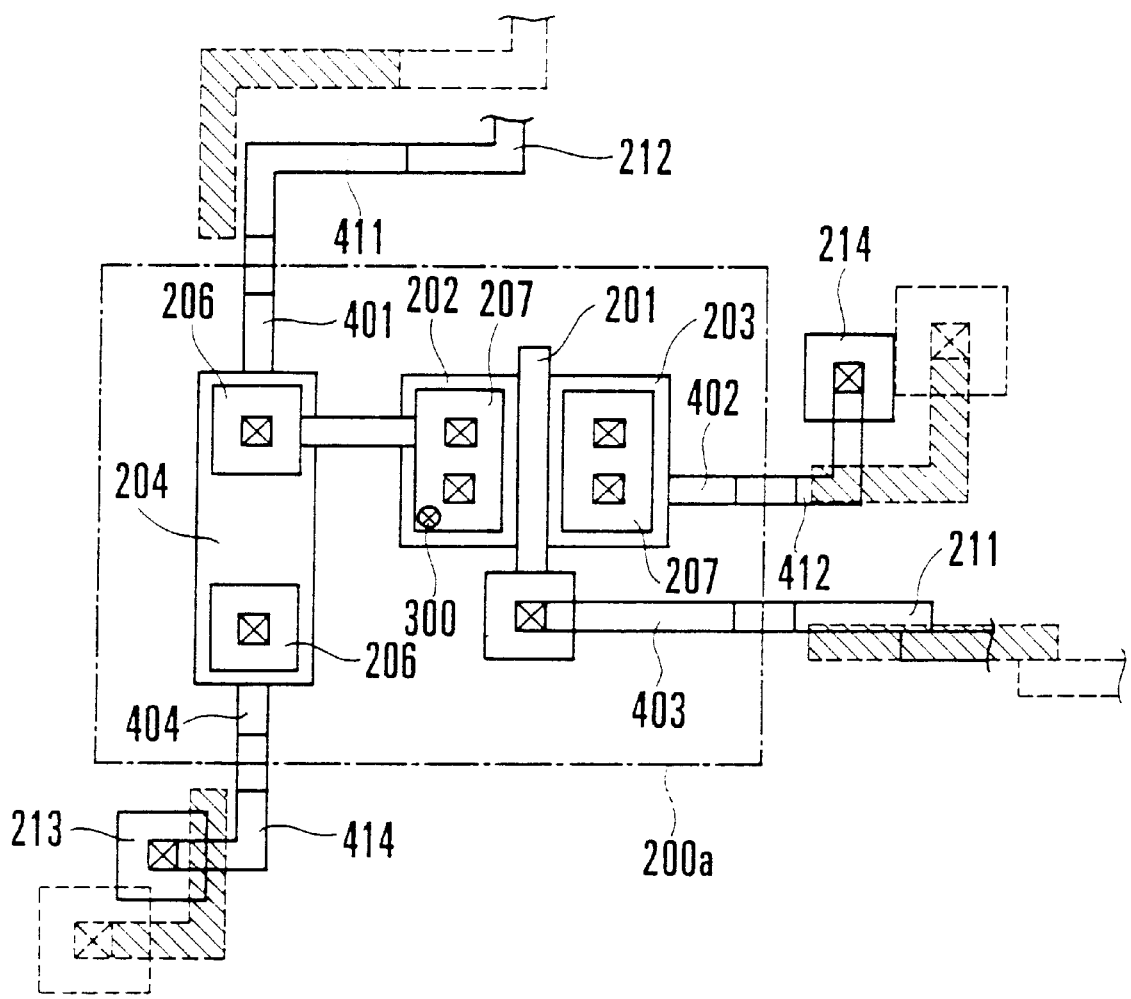
FIG. 7 is a plan view showing a state in which the old and new cells are arranged while the old cell portions are multiplied by 0.8.
Figure 8A:
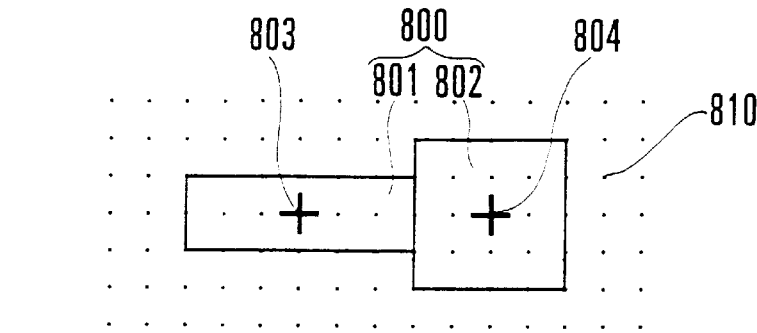
FIGS. 8A to 8D are views for explaining off-grid rounding processing.
Figure 8B:
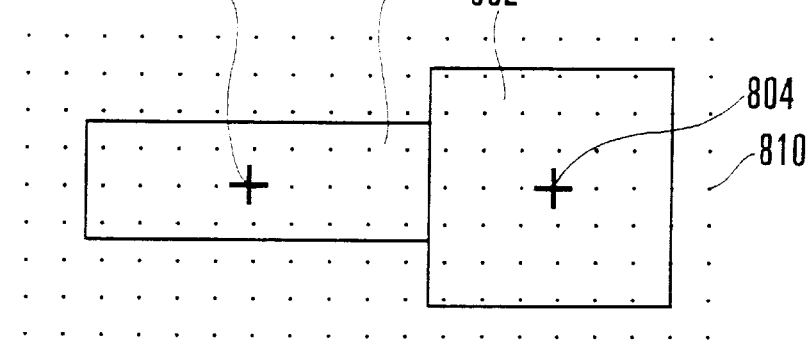
Figure 8C:
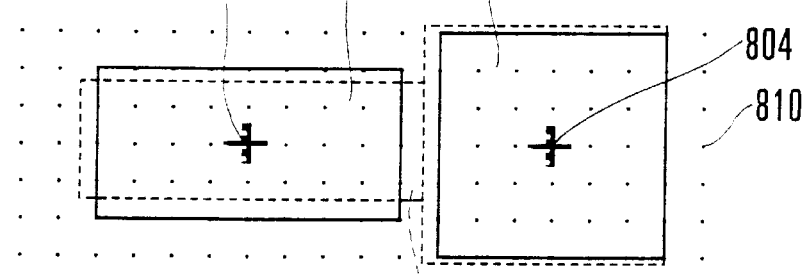
Figure 8D:
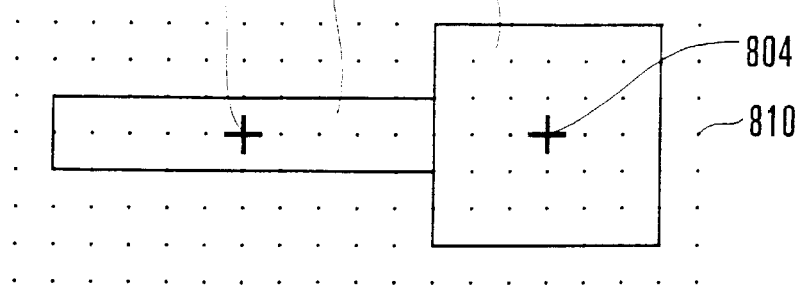

With this operation, EB drawing patterns in which the 0.8-times old cell and the new cell are respectively arranged, as indicated by the solid lines in FIG. 7, are formed on the respective photomasks (step S113).

Not all the gate electrode cell 201, the source cell 202, the drain cell 203, the resistor cell 204, the wiring cell 205, the contact cells 206 and 207, the wiring cell 211, the wiring cell 212, the contact cell 213, and the contact cell 214 are not formed on the same photomask. Of integrated circuits to be formed, EB drawing patterns for forming patterns formed on the same layer are simultaneously placed on the same photomask.

In the above embodiment, verification data is generated by increasing the size of new cell data by a predetermined magnification (x times) and merging it with old cell data. However, the present invention is not limited to this. If the data volume of old cell data is smaller than that of new cell data, the size of the old cell data may be reduced by a predetermined magnification (1/x times), and new cell data may be merged with the resultant data.

In this case, synthetic data is generated by synthesizing the x-times old cell data with the new cell data. In addition, the first EB drawing pattern data is generated by multiplying the x-times old cell data of the corrected synthetic data and connection data from the synthetic data by x. The second EB drawing pattern data is generated by using the new cell data of the corrected data and connection data from the new cell data.

In the above embodiment, the new cell region is subjected to EB exposure first. However, the present invention is not limited to this. EB exposure may be performed on the old cell region first.

In addition, in the above embodiment, the present invention is applied to the manufacture of photomasks. However, the present invention is not limited to this. For example, the present invention can be applied to the manufacture of X-ray masks.

As has been described above, according to the present invention, layout data need not be shrunk to be used for the EB lithography apparatus. If off-grid and the like do not arise in the second data, the second EB drawing pattern data is also free from off-grid and the like. As a consequence, even if layout data with different enlargement/reduction ratios set for EB drawing pattern data mix with each other, EB drawing pattern data can be generated more quickly.

When one or both of the patterns drawn with the first and second EB drawing pattern data need to be shrunk, the first and second EB drawing pattern data are not shrunk on a computer but EB exposure is performed at predetermined magnifications in drawing/exposure processing. This can prevent rounding and generation of slits due to position correction for off-grid and hence allows generation of an ideal photomask without any pattern deformation.

In addition, since regions where wiring data overlap are formed between the first connection data regions and the second connection data regions on the photomask, even if layout data are separately exposed at different magnifications, no slit is generated, and no wiring pattern disconnection occurs.

What is claimed is:

1. A photomask manufacturing method of forming an EB drawing pattern on a photomask by using EB drawing pattern data obtained by layout design and made up of first data formed in a hierarchical structure of a plurality of cells and second data formed in a hierarchical structure of a plurality of cells, the second data being used on a photomask at a predetermined magnification ratio x with respect to the first data, comprising:

the first step of generating third data by multiplying a size of the second data by x;

the second step of generating synthetic data by synthesizing the first data and the third data using first connection data from the first data and second connection data from the third data;

the third step of verifying whether a combination of cells in the synthetic data matches with a circuit on which the layout design is based, and correcting a portion in which an error is detected by the verification;

the fourth step of generating first EB drawing pattern data from the first data and first connection data of the corrected synthetic data;

the fifth step of generating second EB drawing pattern data by multiplying the third data and second connection data of the corrected synthetic data by 1/x; and the sixth step of forming the EB drawing pattern from a first EB drawing pattern formed on said photomask by drawing/exposing the first EB drawing pattern data and a second EB drawing pattern formed on a photomask by drawing/exposing the second EB drawing pattern data while the second EB drawing pattern data is increased by x times with respect to the first EB drawing pattern data.

2. A method according to claim 1, wherein the sixth step comprises the steps of:

forming a first EB drawing pattern on a photomask by drawing/exposing the first EB drawing pattern data; and forming a second EB drawing pattern on a photomask in addition to the first EB drawing pattern by drawing/exposing the second EB drawing pattern data while the second EB drawing pattern data is increased by x times with respect to the first EB drawing pattern data.

3. A method according to claim 1, wherein the sixth step comprises:

forming a second EB drawing pattern on said photomask by drawing/exposing the second EB drawing pattern data while the second EB drawing pattern data is increased by x times with respect to the first EB drawing pattern data; and forming a first EB drawing pattern on said photomask by drawing/exposing the first EB drawing pattern data, and forming the EB drawing pattern by forming the first EB drawing pattern on a photomask in addition to the second EB drawing pattern.

4. A method according to claim 1, wherein the second step comprises the step of forming the first and second connection data so as to partially overlap each other.

5. A method according to claim 1, wherein the corrected synthetic data is used for an inspection on a mask.

6. A method according to claim 5, wherein one of data obtained by reducing the synthetic data at a drawing/exposure magnification and performing layer synthesis for the data and data obtained by performing layer synthesis for the synthetic data and reducing the data at the drawing/exposure magnification is used for an inspection on a photomask.

7. A method according to claim 5, wherein the synthetic data used for a check on a photomask is generated by respectively restoring the first and second EB drawing pattern data to initial magnifications, performing layer synthesis processing by thickening/thinning a predetermined pattern of the data restored to the initial magnifications, reducing the data having undergone the layer synthesis processing at a drawing/exposure reduction magnification, and synthesizing the respective reduced data.

8. A method according to claim 1, wherein the EB drawing pattern is drawn/exposed by electron beam exposure using an electron beam.

9. A mask manufacturing method of forming an EB drawing pattern on a photomask by using EB drawing pattern data obtained by layout design and made up of first data formed in a hierarchical structure of a plurality of cells and second data formed in a hierarchical structure of a plurality of cells, the second data being used on said photomask at a predetermined magnification ratio x with respect to the first data, comprising:

the first step of generating third data by multiplying a size of the first data by 1/x;

the second step of generating synthetic data by synthesizing the third data and the second data using first connection data from the third data and second connection data from the second data;

the third step of verifying whether a combination of cells in the synthetic data matches with a circuit on which the layout design is based, and correcting a portion in which an error is detected by the verification;

the fourth step of generating first EB drawing pattern data by multiplying the third data and first connection data of the corrected synthetic data by x;

the fifth step of generating second EB drawing pattern data from the second data and second connection data of the corrected synthetic data; and the sixth step of forming the EB drawing pattern from a first EB drawing pattern formed on a photomask by drawing/exposing the first EB drawing pattern data and a second EB drawing pattern formed on a photomask by drawing/exposing the second EB drawing pattern data while the second EB drawing pattern data is increased by x times with respect to the first EB drawing pattern data.

10. A method according to claim 9, wherein the sixth step comprises the steps of:

forming a first EB drawing pattern on said photomask by drawing/exposing the first EB drawing pattern data; and forming a second EB drawing pattern on said photomask in addition to the first EB drawing pattern by drawing/exposing the second EB drawing pattern data while the second EB drawing pattern data is increased by x times with respect to the first EB drawing pattern data.

11. A method according to claim 9, wherein the sixth step comprises:

forming a second EB drawing pattern on a photomask by drawing/exposing the second EB drawing pattern data while the second EB drawing pattern data is increased by x times with respect to the first EB drawing pattern data; and forming a first EB drawing pattern on a photomask by drawing/exposing the first EB drawing pattern data, and forming the EB drawing pattern by forming the first EB drawing pattern on a photomask in addition to the second EB drawing pattern.

12. A method according to claim 9, wherein the second step comprises the step of forming the first and second connection data so as to partially overlap each other.

13. A method according to claim 9, wherein the corrected synthetic data is used for inspection on a mask.

14. A method according to claim 13, wherein one of data obtained by reducing the synthetic data at a drawing/exposure magnification and performing layer synthesis for the data and data obtained by performing layer synthesis for the synthetic data and reducing the data at the drawing/exposure magnification is used for a check on said mask.

15. A method according to claim 13, wherein the synthetic data used for a check on said mask is generated by respectively restoring the first and second EB drawing pattern data to initial magnifications, performing layer synthesis processing by thickening/thinning a predetermined pattern of the data restored to the initial magnifications, reducing the data having undergone the layer synthesis processing at a drawing/exposure reduction magnification, and synthesizing the respective reduced data.

16. A method according to claim 9, wherein the EB drawing pattern is drawn/exposed by electron beam exposure using an electron beam.

17. A mask manufacturing method comprising:

the first step of generating first and second EB drawing pattern data each having a hierarchical structure of a plurality of cells; and the second step of forming an EB drawing pattern on a photomask by drawing/exposing the first and second EB drawing pattern data in first and second regions on a photomask at different magnifications.

18. A method according to claim 17, wherein the second step comprises the steps of:

forming a third region on a photomask in which the first and second regions overlap; and forming an EB drawing pattern on said photomask by performing drawing/exposure in the third region by using the first and second EB drawing pattern data.

19. A method according to claim 18, wherein the second step comprises the steps of:

masking the second EB drawing pattern data except for data in the third region in drawing/exposing the first EB drawing pattern data; and masking the first EB drawing pattern data except for data in the third region in drawing/exposing the second EB drawing pattern data.

* * * * *